United States Patent
Olsen et al.

(10) Patent No.: US 12,272,531 B2
(45) Date of Patent: Apr. 8, 2025

(54) DUAL PRESSURE OXIDATION METHOD FOR FORMING AN OXIDE LAYER IN A FEATURE

(71) Applicant: Applied Materials, Inc., Santa Clara, CA (US)

(72) Inventors: Christopher S. Olsen, Fremont, CA (US); Rene George, San Carlos, CA (US); Tsung-Han Yang, San Jose, CA (US); David Knapp, Santa Clara, CA (US); Lara Hawrylchak, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 17/716,419

(22) Filed: Apr. 8, 2022

(65) Prior Publication Data
US 2023/0207291 A1  Jun. 29, 2023

Related U.S. Application Data

(60) Provisional application No. 63/294,683, filed on Dec. 29, 2021.

(51) Int. Cl.
*H01J 37/32* (2006.01)
*C23C 8/12* (2006.01)
(Continued)

(52) U.S. Cl.
CPC .......... *H01J 37/32816* (2013.01); *C23C 8/12* (2013.01); *C23C 8/36* (2013.01);
(Continued)

(58) Field of Classification Search
CPC .......... H01J 37/32816; H01J 37/32825; H01L 21/02238; H01L 21/02252
See application file for complete search history.

(56) References Cited

U.S. PATENT DOCUMENTS

| | | | |
|---|---|---|---|
| 5,263,776 A | 11/1993 | Abraham et al. | |
| 5,682,236 A | 10/1997 | Trolinger et al. | |

(Continued)

FOREIGN PATENT DOCUMENTS

| | | |
|---|---|---|
| EP | 1146139 A1 | 10/2001 |
| WO | 01-75939 A2 | 10/2001 |

OTHER PUBLICATIONS

International Search Report and Written Opinion for International Application No. PCT/US2022/051135 dated Apr. 3, 2023.

*Primary Examiner* — John A Bodnar
(74) *Attorney, Agent, or Firm* — Patterson + Sheridan, LLP

(57) ABSTRACT

A method and apparatus for growing an oxide layer within a feature of a substrate is described herein. The method is suitable for use in semiconductor manufacturing. The oxide layer is formed by exposing a substrate to both a high pressure oxidant exposure and a lower pressure oxygen containing plasma exposure. The high pressure oxidant exposure is performed at a pressure of greater than 10 Torr, while the lower pressure oxygen containing plasma exposure is performed at a pressure of less than about 10 Torr. The features are high-aspect ratio trenches or holes within a stack of silicon oxide and silicon nitride layers.

20 Claims, 9 Drawing Sheets

(51) Int. Cl.
*C23C 8/36* (2006.01)
*H01L 21/02* (2006.01)
*H10B 69/00* (2023.01)

(52) U.S. Cl.
CPC ...... *H01J 37/321* (2013.01); *H01J 37/32357* (2013.01); *H01J 37/3244* (2013.01); *H01L 21/0223* (2013.01); *H01L 21/02238* (2013.01); *H01L 21/02252* (2013.01); *H10B 69/00* (2023.02)

(56) References Cited

U.S. PATENT DOCUMENTS

| | | |
|---|---|---|
| 7,582,555 B1 | 9/2009 | Lang et al. |
| 2001/0026357 A1 | 10/2001 | Ota et al. |
| 2004/0038487 A1* | 2/2004 | Olsen ................ H01L 21/02329 257/E21.268 |
| 2006/0157199 A1 | 7/2006 | Kido et al. |
| 2012/0084045 A1 | 4/2012 | Koshimizu et al. |
| 2013/0171834 A1 | 7/2013 | Haverkamp et al. |
| 2013/0314713 A1 | 11/2013 | Nagai |
| 2015/0221535 A1 | 8/2015 | Nguyen et al. |
| 2017/0045689 A1 | 2/2017 | Zhang et al. |
| 2018/0076026 A1* | 3/2018 | Olsen ................ H01L 21/02164 |

* cited by examiner

DUAL PRESSURE OXIDATION METHOD FOR FORMING AN OXIDE LAYER IN A FEATURE

CROSS-REFERENCE TO RELATED APPLICATIONS

This application claims priority to U.S. Provisional Patent Application No. 63/294,683, filed Dec. 29, 2021, the entirety of which is herein incorporated by reference.

BACKGROUND

Field

Embodiments of the present disclosure generally relate to apparatus for semiconductor device fabrication, and in particular to methods of oxidizing a feature formed in a three dimensional device structure.

Description of the Related Art

The production of silicon integrated circuits has placed difficult demands on fabrication operations to increase the number of devices while decreasing the minimum feature sizes on a chip. These demands have extended to fabrication steps including depositing layers of different materials onto difficult topologies and etching further features within those layers. Manufacturing processes for next generation NAND flash memory involve especially challenging device geometries and scales. NAND is a type of non-volatile storage technology that does not require power to retain data. To increase memory capacity within the same physical space, a three-dimensional NAND (3D NAND) design has been developed. Such a design typically introduces alternating oxide layers and nitride layers which are deposited on a substrate and then etched to produce a structure having one or more surfaces extending substantially perpendicular to the substrate. One structure may have over 100 such layers. Such designs can include high aspect ratio (HAR) structures with aspect ratios of 30:1 or more.

HAR structures are often coated with silicon nitride (SiNx), amorphous silicon, or poly-silicon layers. Conformal oxidation of such structures to produce a uniformly thick oxide layer is challenging. Uniform oxidation of each structure is increasingly difficult with increased aspect radios, such as HAR structures with an aspect ratio of greater than 50:1 or greater than 70:1.

Therefore, an improved method and apparatus for forming oxide layers within HAR structures is needed.

SUMMARY

The present disclosure generally relates to methods and apparatus for growing a layer on a substrate. In one embodiments, a method of processing a substrate is described. The method is suitable for use in semiconductor manufacturing. The method includes exposing a substrate to an oxidant at a first pressure of greater than about 20 Torr. After exposing the substrate to the oxidant at the first pressure, a pressure around the substrate is reduced from the first pressure to a second pressure of less than about 10 Torr. After reducing the pressure to the second pressure, the substrate is exposed to an oxygen containing plasma while the pressure around the substrate is at the second pressure.

In another embodiment, another method of processing a substrate suitable for use in semiconductor manufacturing is described. The method includes exposing a plurality of features having a nitride wall surface on a substrate to an oxidant at a first pressure of greater than about 50 Torr to form an oxide layer on the nitride wall surface. After exposing the plurality of features to the oxidant at the first pressure, a pressure around the substrate is reduced from the first pressure to a second pressure of less than about 5 Torr. After reducing the pressure to the second pressure, the substrate is exposed to an oxygen containing plasma while the pressure around the substrate is at the second pressure to increase a thickness of the oxide layer.

In yet another embodiment, a non-transitory computer-readable medium is described. The non-transitory computer-readable medium stores instructions suitable for use in semiconductor manufacturing. When the instructions are executed by a processor, the computer system performs several operations. The operations include exposing a substrate to an oxidant at a first pressure of greater than about 20 Torr. After exposing the substrate to the oxidant, a pressure around the substrate is reduced from the first pressure to a second pressure of less than about 10 Torr. After reducing the pressure to the second pressure, the substrate is exposed to an oxygen containing plasma while the pressure around the substrate is at the second pressure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
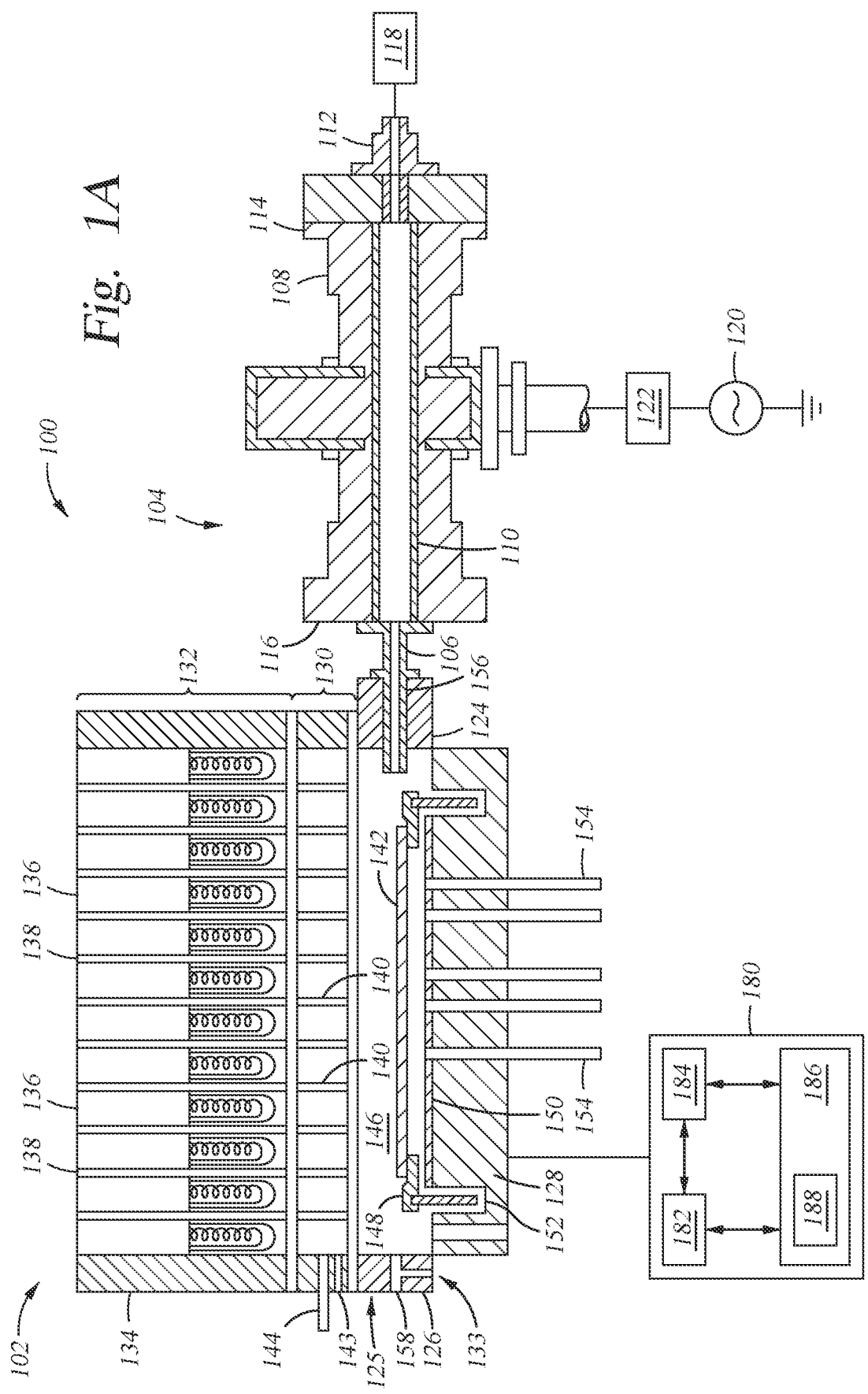
FIG. 1A is a cross-sectional schematic side view of a first process system, according to embodiments described herein.

The present disclosure generally relates to methods and apparatus for conformal oxidation of high aspect ratio structures within a device stack. The method includes the utilization of a high-pressure exposure of a substrate to an oxidant. The high-pressure exposure of the substrate to the oxidant forms an oxide layer on a silicon nitride, amorphous silicon, or poly-silicon layer within the high aspect ratio trenches. The oxide layer is a conformal oxide layer with a conformality of 95% or greater. The oxide layer is grown to a thickness of about 2 nm to about 3 nm during the high-pressure exposure of the substrate. The oxide layer is grown from the silicon nitride, amorphous silicon, or poly-silicon layer, such that a portion of the silicon nitride, amorphous silicon, or poly-silicon layer is oxidized.

Subsequent the high-pressure exposure of the substrate to the oxidant, the pressure around the substrate is reduced. The reduced pressure enables the formation of an oxygen-radical containing plasma. The oxygen-radical containing plasma also grows the oxide layer on the silicon nitride layer. The oxide layer formed during the high-pressure exposure serves as a base layer and the oxide layer is grown during exposure to the oxygen-radical containing plasma. The oxide layer grows uniformly due to the previously formed oxide layer reducing oxidant flux rate into the shallower portions of each high aspect ratio structure. The thickness of the oxide layer is grown to greater than about 5 nm, such as greater than about 6 nm, such as about 6 nm to about 8 nm during the exposure to the oxygen-radical containing plasma. The conformality of the oxide layer after completion of the exposure to the oxygen-radical containing plasma is still greater than about 95%.

The high-pressure oxidant exposure enables a greater number of species to arrive at a bottom of a high-aspect ratio feature of a substrate to form a conformal layer. However, the high-pressure oxidant has a low growth rate on amorphous silicon, poly-silicon and silicon nitride. Therefore, the second oxidant exposure of the oxygen-radical containing plasma is utilized to increase the growth rate of the oxide layer to achieve a target thickness with a reduced oxidation time. The oxygen-radical containing plasma exposure may be repeated or lengthened to increase the thickness of the oxide layer.

Each one of the high pressure oxide exposure and the oxygen-radical containing plasma exposure may be performed either in the same process system or in different process systems. Performing both process operations within one process system may enable for increased throughput and reduces overall cost. However, performing both a high pressure process and a plasma containing process within the same process system may be difficult with some process chamber architectures. An improved process system is described herein, which enables both the high pressure process and the plasma containing process to be formed within a same process volume.

In other embodiments, a substrate is moved between two or more process systems, such that a first process system performs the high pressure process and a second process system performs the plasma containing process. Multiple process system types may be utilized as described herein. The processes described herein may be performed during the manufacturing of a 3D NAND structure.

FIG. 1A is a cross-sectional view of a first process system 100 according to embodiments described herein. The first process system 100 includes a process chamber 102 and a remote plasma source 104. The process chamber 102 may be a rapid thermal processing (RTP) chamber. The remote plasma source 104 may be any suitable remote plasma source, such as microwave coupled plasma source, that can operate at a power, for example, of about 6 kW. The remote plasma source 104 is coupled to the process chamber 102 to flow plasma formed in the remote plasma source 104 toward the process chamber 102. The remote plasma source 104 is coupled to the process chamber 102 via a connector 106. Radicals formed in the remote plasma source 104 flow through the connector 106 into the process chamber 102 during processing of a substrate.

The remote plasma source 104 includes a body 108 surrounding a tube 110 in which plasma is generated. The tube 110 may be fabricated from quartz or sapphire. The body 108 includes a first end 114 coupled to an inlet 112, and one or more gas sources 118 may be coupled to the inlet 112 for introducing one or more gases into the remote plasma source 104. In one embodiment, the one or more gas sources 118 include an oxygen containing gas source, and the one or more gases include an oxygen containing gas. The body 108 includes a second end 116 opposite the first end 114, and the second end 116 is coupled to the connector 106. A coupling liner (not shown) may be disposed within the body 108 at the second end 116. A power source 120 (e.g., an RF power source) may be coupled to the remote plasma source 104 via a match network 122 to provide power to the remote plasma source 104 to facilitate the forming of the plasma. The radicals in the plasma are flowed to the process chamber 102 via the connector 106.

The process chamber 102 includes a chamber body 125, a substrate support portion 128, and a window assembly 130. The chamber body 125 includes a first side 124 and a second side 126 opposite the first side 124. In some embodiments, a lamp assembly 132 enclosed by an upper side wall 134 is positioned over and coupled to the window assembly 130. The lamp assembly 132 may include a plurality of lamps 136 and a plurality of tubes 138, and each lamp 136 may be disposed in a corresponding tube 138. The window assembly 130 may include a plurality of light pipes 140, and each light pipe 140 may be aligned with a corresponding tube 138 so the thermal energy produced by the plurality of lamps 136 can reach a substrate disposed in the process chamber 102. In some embodiments, a vacuum condition can be produced in the plurality of light pipes 140 by applying a vacuum to an exhaust 144 fluidly coupled to the plurality of light pipes 140. The window assembly 130 may have a conduit 143 formed therein for circulating a cooling fluid through the window assembly 130.

A processing region 146 may be defined by the chamber body 125, the substrate support portion 128, and the window assembly 130. A substrate 142 is disposed in the processing region 146 and is supported by a support ring 148 above a reflector plate 150. The support ring 148 may be mounted on a rotatable cylinder 152 to facilitate rotating of the substrate 142. The cylinder 152 may be levitated and rotated by a magnetic levitation system (not shown). The reflector plate 150 reflects energy to a backside of the substrate 142 to facilitate uniform heating of the substrate 142 and promote energy efficiency of the first process system 100. A plurality of fiber optic probes 154 may be disposed through the substrate support portion 128 and the reflector plate 150 to facilitate monitoring a temperature of the substrate 142.

A liner assembly 156 is disposed in the first side 124 of the chamber body 125 for radicals to flow from the remote plasma source 104 to the processing region 146 of the process chamber 102. The liner assembly 156 may be fabricated from a material that is oxidation resistant, such as quartz, in order to reduce interaction with process gases, such as oxygen radicals. The liner assembly 156 is designed to reduce flow constriction of radical flowing to the process chamber 102. The liner assembly 156 is described in detail below. The process chamber 102 further includes a distributed pumping structure 133 formed in the substrate support portion 128 adjacent to the second side 126 of the chamber body 125 to tune the flow of radicals from the liner assembly 156 to the pumping ports. The distributed pumping structure 133 is located adjacent to the second side 126 of the chamber body 125.

An opening 158 is disposed through the second side 126 of the chamber body 125. The opening 158 is configured to have a substrate passed therethrough. The opening 158 may be disposed adjacent to a transfer chamber or another process system.

A controller 180 may be coupled to various components of the first process system 100, such as the process chamber 102 and/or the remote plasma source 104 to control the operation thereof. The controller 180 generally includes a central processing unit (CPU) 182, a memory 186, and support circuits 184 for the CPU 182. The controller 180 may control the first process system 100 directly, or via other computers or controllers (not shown) associated with particular support system components. The controller 180 may be one of any form of general-purpose computer processor that can be used in an industrial setting for controlling various chambers and sub-processors. The memory 186, or computer-readable medium, may be one or more of readily available memory such as random access memory (RAM), read only memory (ROM), floppy disk, hard disk, flash drive, or any other form of digital storage, local or remote. The support circuits 184 are coupled to the CPU 182 for supporting the processor in a conventional manner. The support circuits 184 include cache, power supplies, clock circuits, input/output circuitry and subsystems, and the like. Processing operations may be stored in the memory 186 as a software routine 188 that may be executed or invoked to turn the controller 180 into a specific purpose controller to control the operations of the first process system 100. The controller 180 may be configured to perform any methods described herein.

Figure 1B:
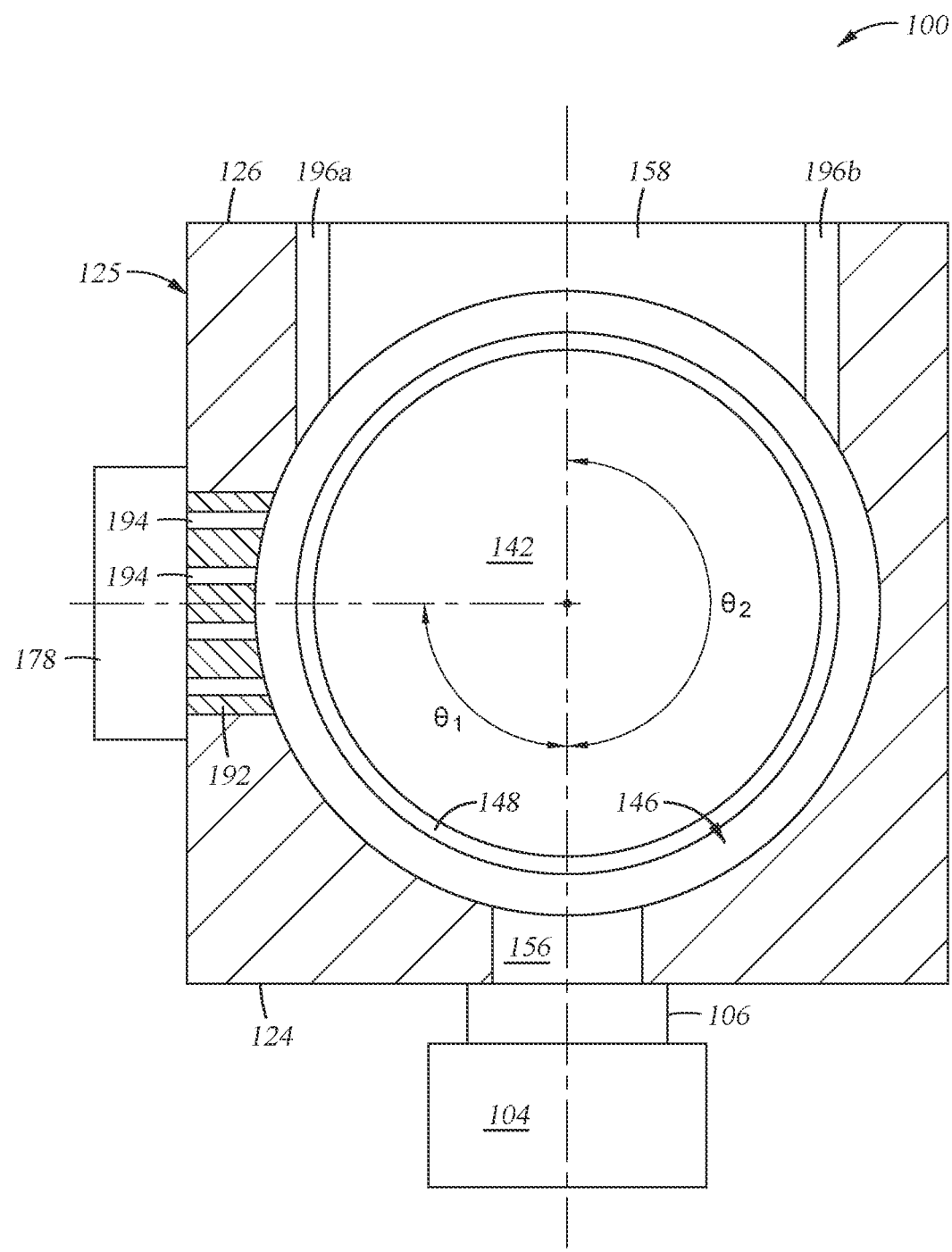
FIG. 1B is a cross-sectional schematic plan view of the first process system of FIG. 1A, according to embodiments described herein.

FIG. 1B is a cross-sectional schematic plan view of the first process system 100 of FIG. 1A. The first process system 100 includes both the remote plasma source 104 and a gas injector 192. The liner assembly 156 of the remote plasma source 104 and the gas injector 192 are disposed at different points along the circumference of the processing region 146. Including both of the remote plasma source 104 and the gas injector 192 disposed through the same chamber body 125 and in communication with the same processing region 146 enables both of a high pressure oxidation operation and a low pressure plasma operation to be performed within the same processing region 146.

One or more exhaust passages 196a, 196b are disposed adjacent to and/or within the opening 158. The one or more exhaust passages 196a, 196b are exhaust outlets and are configured to exhaust gas and/or plasma from the processing region 146. The one or more exhaust passages 196a, 196b are coupled to one or more exhaust pumps (not shown) to remove the exhaust gases and/or plasmas within the processing region 146. The one or more exhaust passages 196a, 196b include at least a first exhaust passage 196a and a second exhaust passage 196b. The first exhaust passage 196a is disposed on a first side of the opening 158, while the second exhaust passage 196b is disposed on the opposite side of the opening 158. Utilizing two exhaust passages 196a, 196b on opposite sides of the opening 158 enables more even evacuation of process gases and plasmas during processing.

The gas injector 192 is disposed through a wall of the chamber body 125. The gas injector 192 includes a plurality of gas passages 194 therethrough and in fluid communication with the processing region 146. The gas injector 192 is configured to inject process gases into the processing region 146 and across a top surface of the substrate 142. The gas injector 192 and each of the gas passages 194 disposed therein are coupled to a process gas source 178. The process gas source 178 is configured to supply one or more oxidants. The one or more oxidants include one or a mixture of hydrogen ($H_2$), oxygen ($O_2$), ozone ($O_3$), nitrous oxide ($N_2O$), water/water vapor ($H_2O$), hydrogen peroxide ($H_2O_2$), or hydroxide ($OH^-$).

The center of the gas injector 192 may be disposed at a first angle $\theta_1$ with respect to the center of the liner assembly 156 of the remote plasma source 104. The first angle $\theta_1$ is about 45 degrees to about 135 degrees, such as about 60 degrees to about 120 degrees, such as about 75 degrees to about 105 degrees. In some embodiments, the first angle $\theta_1$ is about 90 degrees, such that the gas injector 192 and the liner assembly 156 of the remote plasma source 104 are perpendicular to one another along the circumference of the processing region 146. Positioning each of the gas injector 192 and the liner assembly 156 at separate circumferential positions of the processing region enables both components to be utilized independently within the first process system 100.

The center of the liner assembly 156 of the remote plasma source 104 is disposed at a second angle $\theta_2$ with respect to a center of the opening 158 through which the substrate 142 is configured to pass into and out of the processing region 146. The second angle $\theta_2$ is about 150 degrees to about 210 degrees, such as about 175 degrees to about 195 degrees, such as about 190 degrees. In some embodiments, the liner assembly 156 and the opening 158 are aligned along a similar axis. Aligning the liner assembly 156 and the opening 158 enables plasma to be flowed evenly across the substrate 142 and evacuated through one or more exhaust passages 196a, 196b on either side of the opening 158. Positioning each of the gas injector 192 and the opening 158 at angles to one another enables a spiral gas flow across the surface of the substrate 142. The spiral gas flow has been shown to enable more even oxide formation.

Figure 2A:
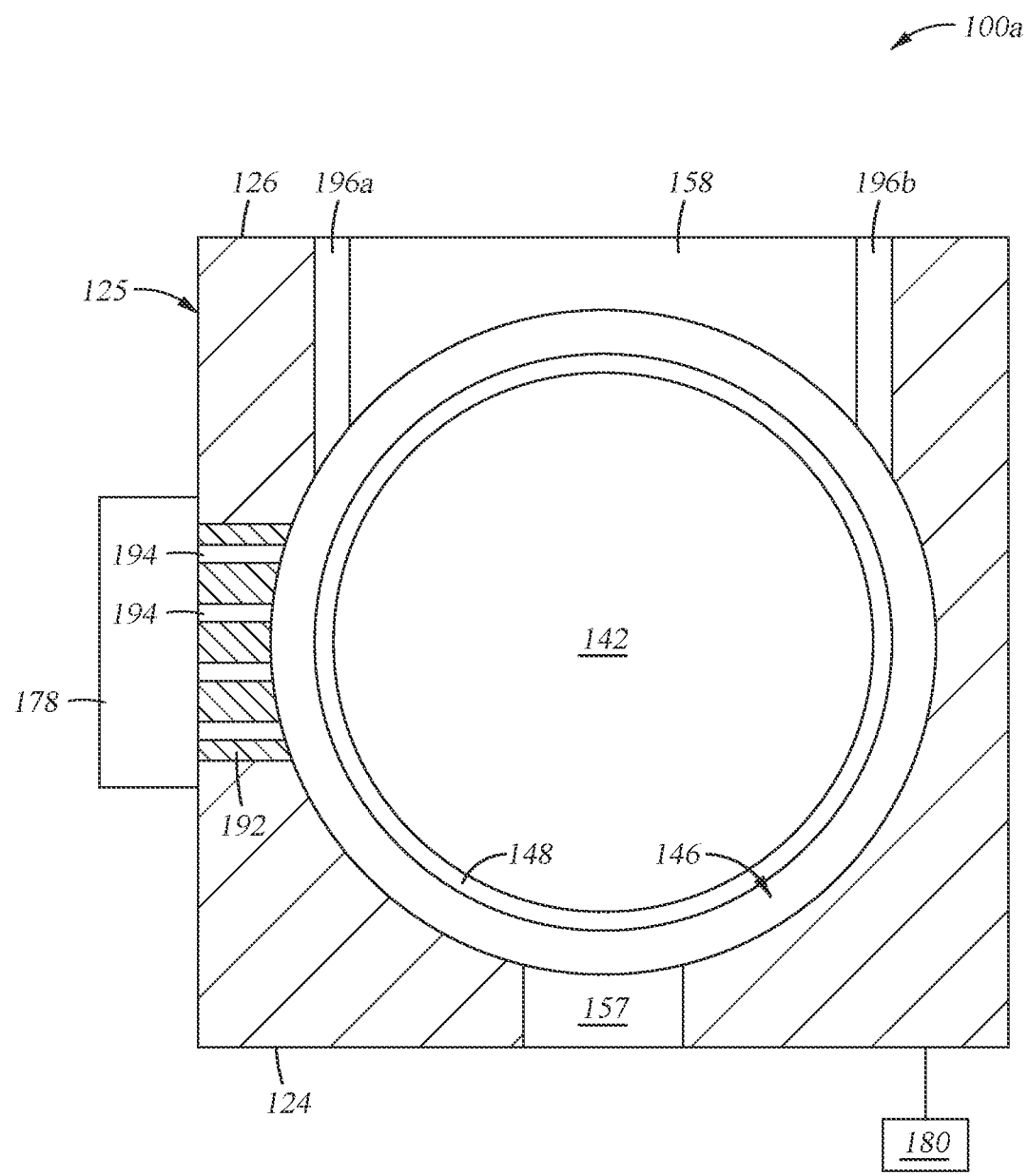
FIG. 2A is a cross-sectional schematic plan view of a second process system, according to embodiments described herein.
Figure 2B:
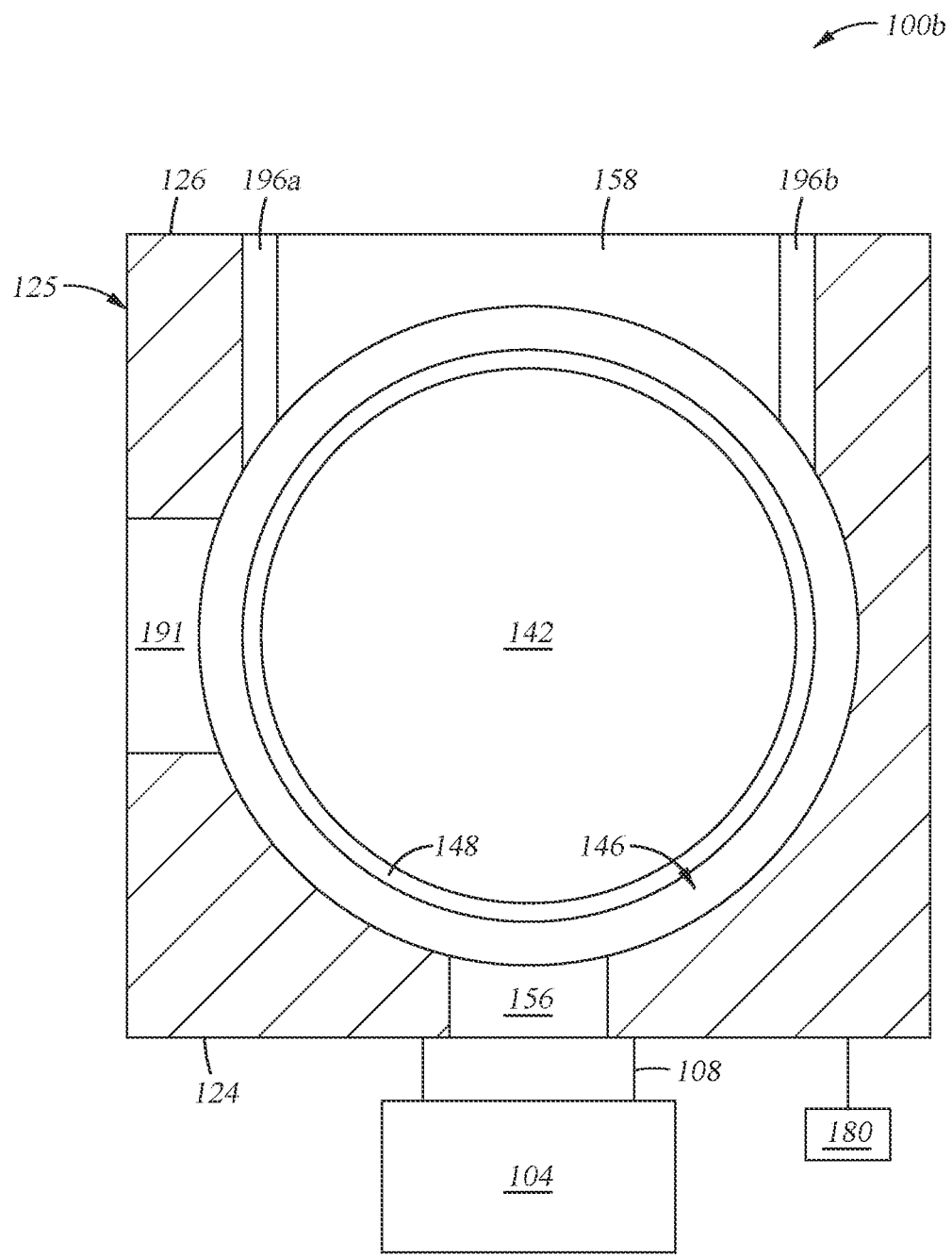
FIG. 2B is a cross-sectional schematic plan view of a third process system, according to embodiments described herein.

The second process system 100a and the third process system 100b of FIGS. 2A and 2B may be utilized in place of the first process system 100 of FIGS. 1A-1B. The second process system 100a and the third process system 100b are separate process systems, but may be utilized together to perform the processes described herein. Each of the second process system 100a and the third process system 100b are vacuum coupled, such that a substrate, such as the substrate 142, passing between the second process system 100a and the third process system 100b is kept in a vacuum environment and not exposed to atmosphere. FIG. 2A is a cross-sectional schematic plan view of the second process system 100a. FIG. 2B is a cross-sectional schematic plan view of the third process system 100b. The second process system 100a and the third process system 100b are similar to the first process system 100, but the second process system 100a does not include a remote plasma source 104 and the third process system 100b does not include the gas injector 192.

Separating the remote plasma source 104 and the gas injector 192 into two separate process systems 100a, 100b enables the high pressure oxidation operation to be performed in a separate processing region 146 than the a low pressure plasma operation. Separating the process systems 100a, 100b may enable increased process flexibility and increase efficiency of maintenance performed on either of the process systems 100a, 100b.

As shown in FIG. 2A, the second process system 100a includes a passage 157 opposite the opening 158. The passage 157 may be configured to include one or more sensors, exhaust liners, or process gas injectors disposed therein. As shown in FIG. 2B, the third process system 100b includes a passage 191 perpendicular to the opening 158 and the liner assembly 156. The passage 191 may be configured to include one or more sensors or exhaust liners.

Figure 3:
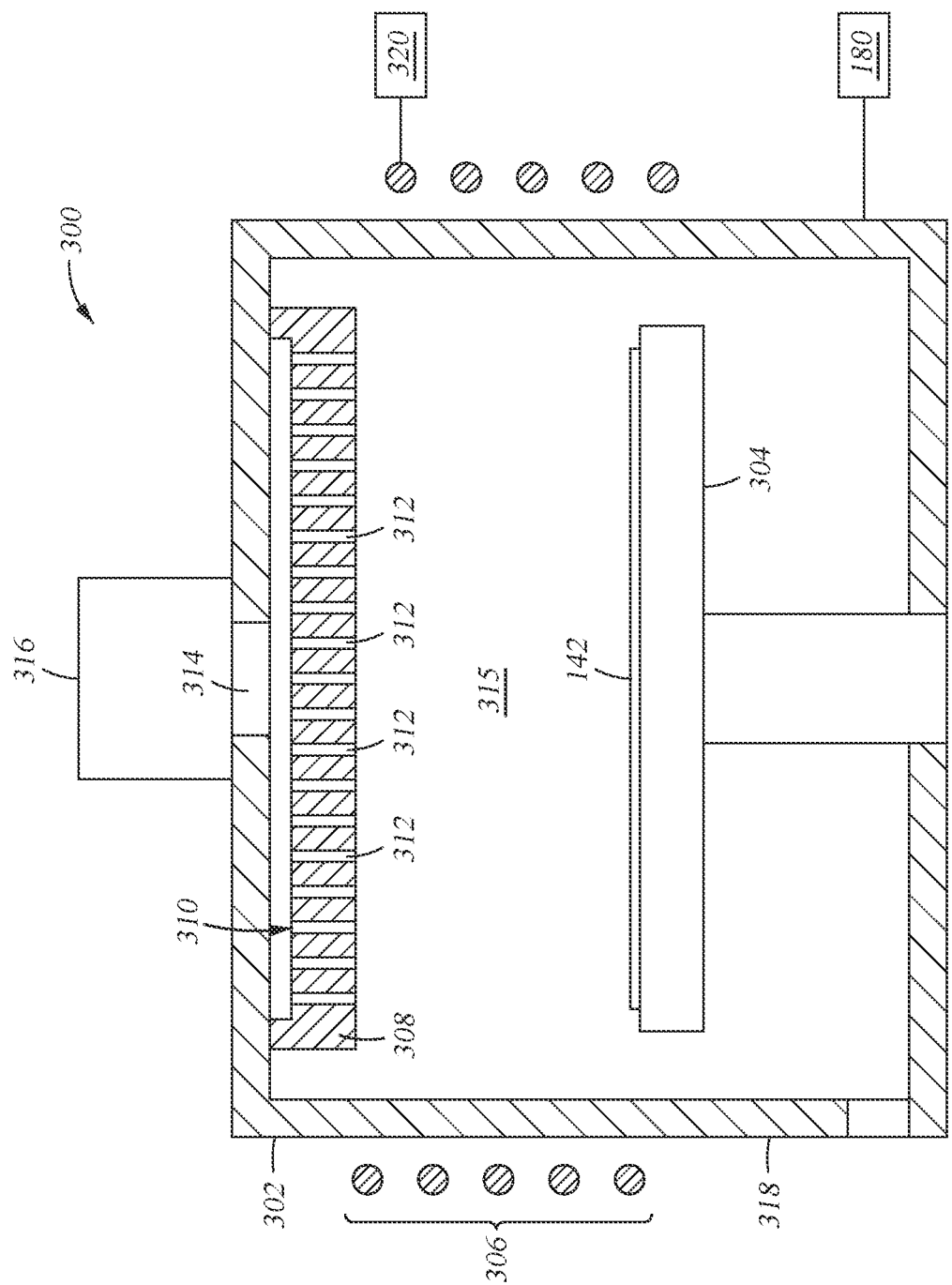
FIG. 3 is a cross-sectional schematic side view of a fourth process system, according to embodiments described herein.

FIG. 3 is a cross-sectional schematic side view of a fourth process system 300. The fourth process system 300 includes a chamber body 302, a showerhead 308 disposed within the chamber body 302, a substrate support 304, and an inductive coil 306 disposed around the chamber body 302. The fourth process system 300 may be used in place of any one of the first process system 100, the second process system 100a, or the third process system 100b. The fourth process system 300 is configured to enable a high-pressure oxidation operation as well as a low-pressure plasma operation.

The showerhead 308 is disposed within the chamber body 302 and above the substrate support 304. The showerhead 308 is configured to distribute one or a combination of process gases and plasmas into a processing region 315 of the fourth process system 300. The showerhead 308 includes a plurality of gas passage 312 formed therethrough. The plurality of gas passages 312 may be in fluid communication with a plenum 310 disposed above the showerhead 308 as well as the processing region 315. A gas source 316 is in fluid communication with the plenum 310 through a passage 314 formed within the chamber body 302. The gas source 316 is configured to supply one or more process gases, such as one or more oxidants. The one or more oxidants include one or a mixture of hydrogen ($H_2$), oxygen ($O_2$), ozone ($O_3$), nitrous oxide ($N_2O$), water/water vapor ($H_2O$), hydrogen peroxide ($H_2O_2$), or hydroxide ($OH^-$). Mixtures of water ($H_2O$), ozone ($O_3$) and/or hydrogen peroxide ($H_2O_2$) may be delivered by the gas source 316 during a high pressure operation, such as an operation with a pressure of greater than about 50 Torr. A mixture of hydrogen ($H_2$) and oxygen ($O_2$) is introduced during a low pressure operation, such as an operation at a pressure of about 0.5 Torr to about 5 Torr. The hydrogen and oxygen mixture during the low pressure operation improves oxygen radical ($O^*$) species lifetimes.

One or more exhaust passages 318 are formed through the chamber body 302. The one or more exhaust passages 318 are formed below the substrate support 304 and the inductive coil 306. The one or more exhaust passages 318 are coupled to an exhaust pump (not shown) and configured to remove gases and/or plasmas from the processing region 315. The substrate support 304 is disposed within the processing region 315 and is configured to support a substrate, such as the substrate 142. The substrate support 304 is configured to rotate around a central axis and actuate in one or more directions.

The inductive coil 306 is disposed around the circumference of the chamber body 302. The inductive coil 306 is configured to generate a plasma within the processing region 315. The inductive coil 306 is coupled to a power source 320. The power source 320 is a radio frequency (RF) power source. The power source 320 is configured to apply power to the inductive coil 306 and generate the plasma within the processing region 315 during a plasma operation.

Figure 4:
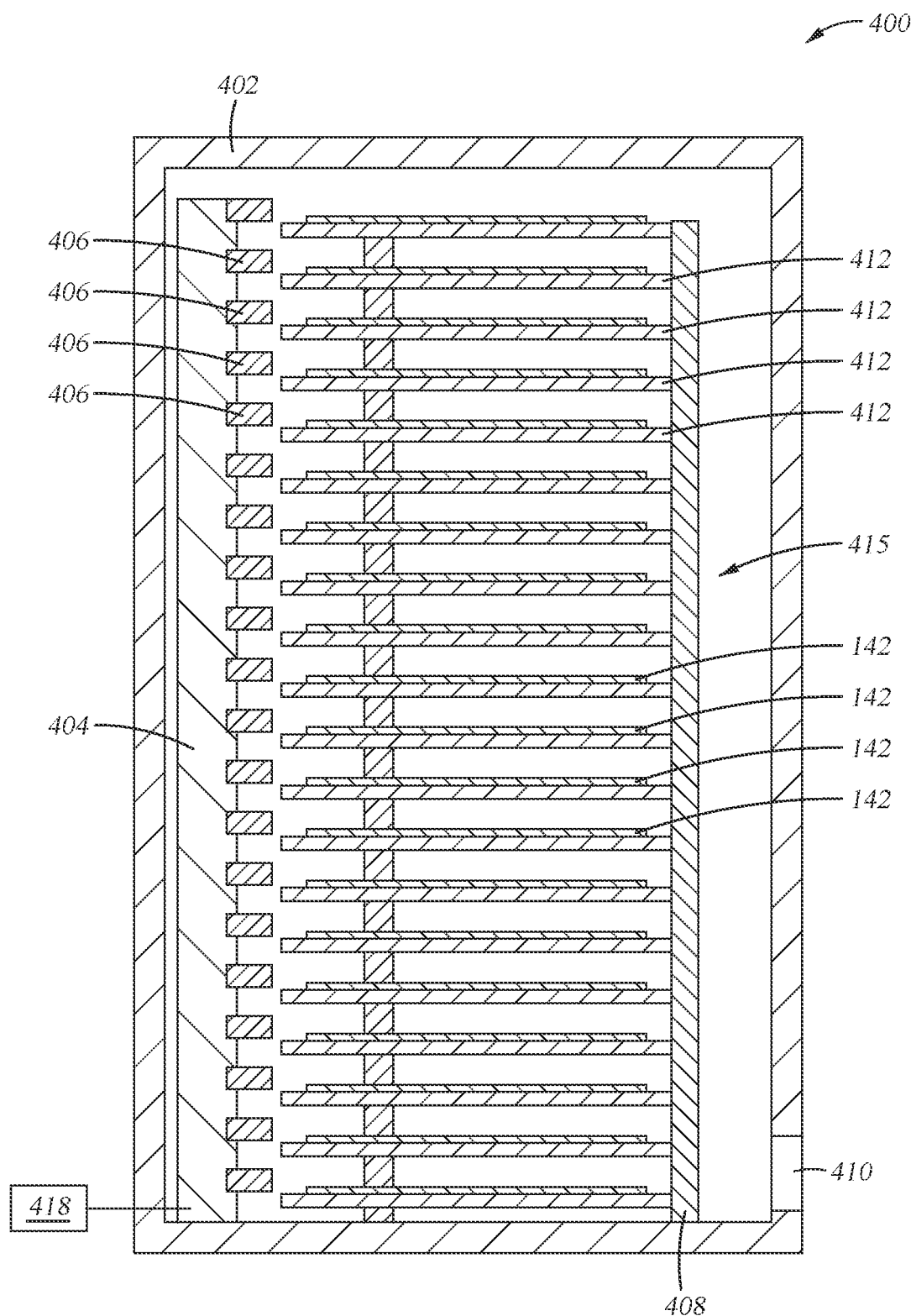
FIG. 4 is a cross-sectional schematic side view of a fifth process system, according to embodiments described herein.

FIG. 4 is a cross-sectional schematic side view of a fifth process system 400. The fifth process system 400 is a batch process system, such that a plurality of substrates 142 may be processed simultaneously. The fifth process system 400 may be configured to perform a high-pressure oxidation operation. Oxidant is supplied to a processing region 415 of the fifth process system 400 from a plurality of gas inlets 406. The plurality of gas inlets 406 may be nozzles or injectors and are coupled to a gas distribution tower 404. The plurality of gas inlets 406 are disposed along the gas distribution tower 404 and configured to supply a process gas to a variety of positions within the processing region 415. A gas supply 418 is fluidly coupled to the gas distribution tower 404 and the plurality of gas inlets 406. The gas supply 418 is configured to supply one or a mixture of hydrogen ($H_2$), oxygen ($O_2$), ozone ($O_3$), nitrous oxide ($N_2O$), water/water vapor ($H_2O$), hydrogen peroxide ($H_2O_2$), or hydroxide ($OH^-$). Mixtures of water ($H_2O$), ozone ($O_3$) and/or hydrogen peroxide ($H_2O_2$) may be delivered by the gas supply 418 during a high pressure operation, such as an operation with a pressure of greater than about 50 Torr. A mixture of hydrogen ($H_2$) and oxygen ($O_2$) may then be introduced during a low pressure operation, such as an operation at a pressure of less than about 1 Torr to the fifth process system 400 to perform a batch low pressure operation. The hydrogen and oxygen mixture combusts and forms atomic oxygen during the low pressure operation.

The plurality of substrates 142 are disposed on a carrier assembly 408. The carrier assembly 408 includes a plurality of substrate support shelves 412. Each support shelf 412 has a substrate support surface. The substrate support surface may include a single support ring, or a plurality of discreet substrate support ledges. Each pair of support shelves 412 forms a slot therebetween for a substrate 142 to be inserted. Each one of the support shelves 412 is associated with at least one gas inlet 406, such that at least one gas inlet 406 is disposed parallel to or above each support shelf 412. Each of the support shelves 412 are parallel to one another and form a column of support shelves 412. Both of the carrier assembly 408 and the gas distribution tower 404 are disposed within the processing region 415 of a chamber body 402.

One or more exhaust passages 410 are formed through the chamber body 402. The one or more exhaust passages 410 are formed below the substrate support shelves 412. The one or more exhaust passages 410 are coupled to an exhaust pump (not shown) and configured to remove gases and/or plasmas from the processing region 415.

Figure 5C:
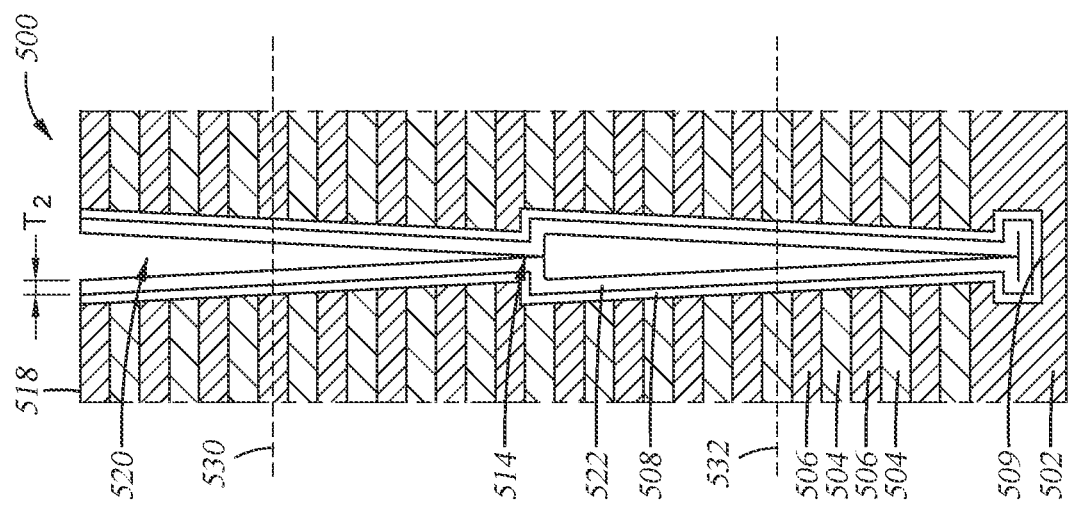
FIGS. 5A-5C are cross-sectional schematic side views of a device stack during a method of formation, according to embodiments described herein.
Figure 5B:
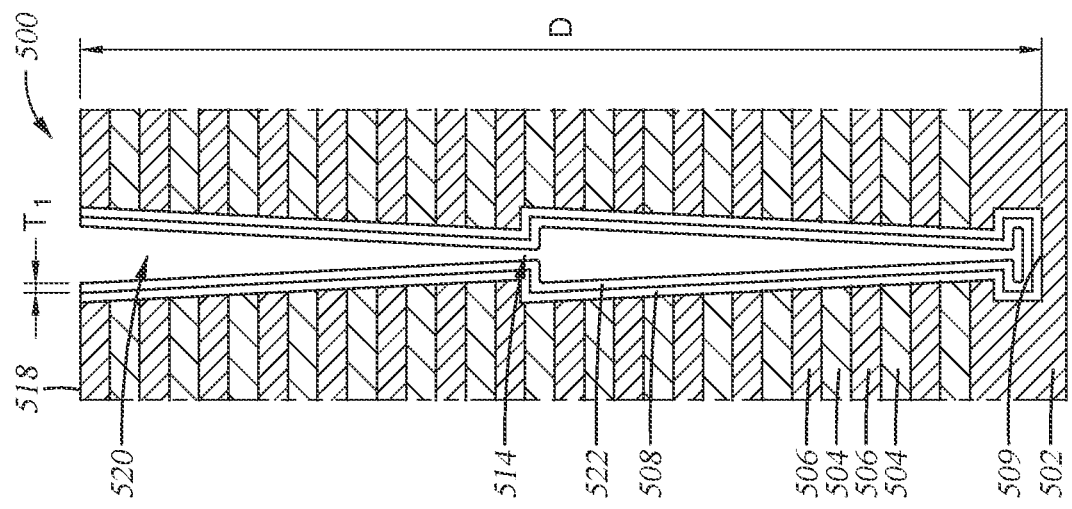
Figure 5A:
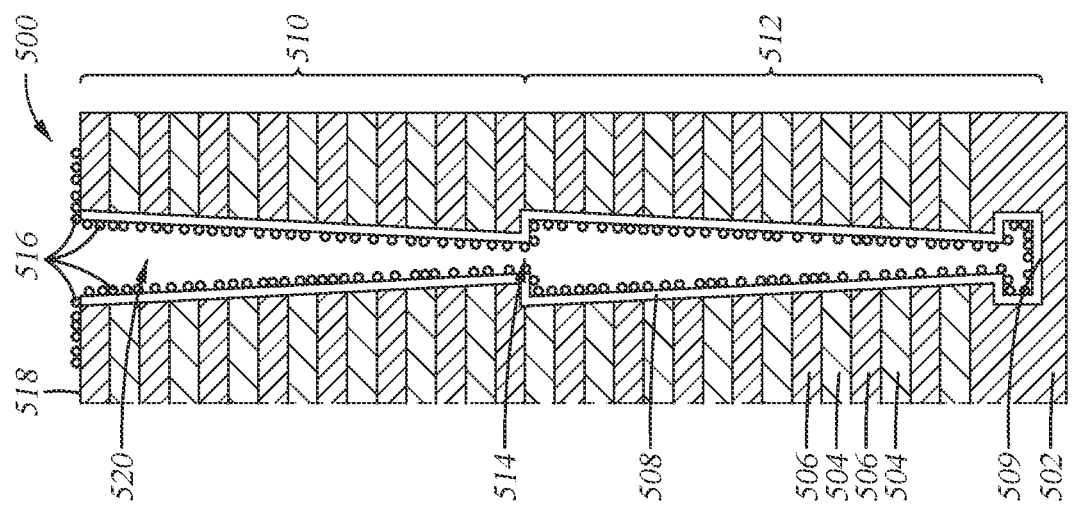

FIGS. 5A-5C are cross-sectional schematic side views of a device stack 500 during a method 600 of formation. The device stack 500 includes a plurality of layers, such as a plurality of oxide layers 502 and a plurality of nitride layer 504. The oxide layers 502 are a silicon oxide material. The nitride layers 504 are a silicon nitride material. Each pair of oxide layers 502 is separated by a nitride layer 504, such that the oxide layers 502 and the nitride layers 504 are disposed in an alternating stack. Each of the oxide layers 502 and the nitride layers 504 have a thickness of about 10 nm to about 30 nm, such as about 15 nm to about 25 nm, such as about 20 nm. A single oxide layer 502 and a contacting single nitride layer 504 coupled together form a pair 505. There are over 100 pairs 505 of oxide layers 502 and nitride layers 504, such that there are at least 100 oxide layers 502 and there are at least 100 nitride layers 504. In some embodiments, there are over 125 pairs 505 of oxide layers 502 and nitride layers 504, such that there are at least 125 oxide layers 502 and there are at least 125 nitride layers 504. In some embodiments, there are over 140 pairs 505 of oxide layers 502 and nitride layers 504, such that there are at least 140 oxide layers 502 and there are at least 140 nitride layers 504.

The device stack 500 includes a plurality of features 520 formed therein. The features 520 may be a trench or a hole formed in the device stack 500. The feature 520 is formed through a plurality of pairs 505, such that the features 520 are formed through at least 100 pairs 505, such as at least 125 pairs 505, such as at least 140 pairs 505. The features 520 are formed from a top surface 518 of the device stack 500 to a bottom surface 509 of each feature 520. Each of the features 520 are formed of two portions 510, 512. The two portions 510, 512 are a first portion 510 and a second portion 512. The first portion 510 is disposed inward from the top surface 518 and the second portion 512 is adjacent to the first portion 510 and extends from a bottom of the first portion 510 further inward away from the top surface 518. The first portion 510 includes at least 50 pairs 505, such as at least 60 pairs 505, such as at least 70 pairs 505. Similarly, the second portion 512 includes at least 50 pairs 505, such as at least 60 pairs 505, such as at least 70 pairs 505. The first portion 510 and the second portion 512 are separated by a transition 514.

As each of the portions 510, 512 of the features 520 increases in depth within the device stack 500 the feature 520 decreases in width, such that the feature 520 narrows. Therefore, as the first portion 510 extends away from the top surface 518 and towards the bottom surface 509, the feature 520 narrows. Similarly, as the second portion 512 extends away from the top surface 518 and towards the bottom surface 509, the feature 520 narrows. At the transition 514, the width of the feature 520 expands as the trench extends from the first portion 510 to the second portion 512. The feature 520 expands as the transition 514 due to the use of two separate processes for forming the features 520. The second portion 512 may be formed before the formation of the first portion 510. This causes the transition 514 to include a change of width. The bottom surface 509 of each of the features 520 may further include a base, which is wider than the bottom of the second portion 512.

The inside surface of each of the features 520 is coated with a silicon layer 508, such that a silicon layer 508 is formed over the walls of each of the features 520. The silicon layer 508 serves as a liner of each of the features 520 and covers both the first portion 510 and the second portion 512. The silicon layer 508 is deposited using an atomic layer deposition (ALD) process. The silicon layer 508 may be a silicon nitride layer, amorphous silicon, or poly-silicon. In some embodiments, the silicon layer 508 is a silicon nitride layer.

Each of the features has an aspect ratio. The aspect ratio is a ratio of the depth of the features 520 to the width of the features 520 measured at the top opening, which restricts reactant transport. The width of the features 520 is the width at the top opening of the first portion 510 or the top opening of the second portion 512, such that the width of the features 520 is measured as the width adjacent to the top surface 518 of the device stack 500. The aspect ratio is greater than about 70:1, such as greater than about 75:1, such as greater than about 100:1, such as greater than about 120:1, such as greater than about 150:1, such as greater than about 170:1.

Figure 6:
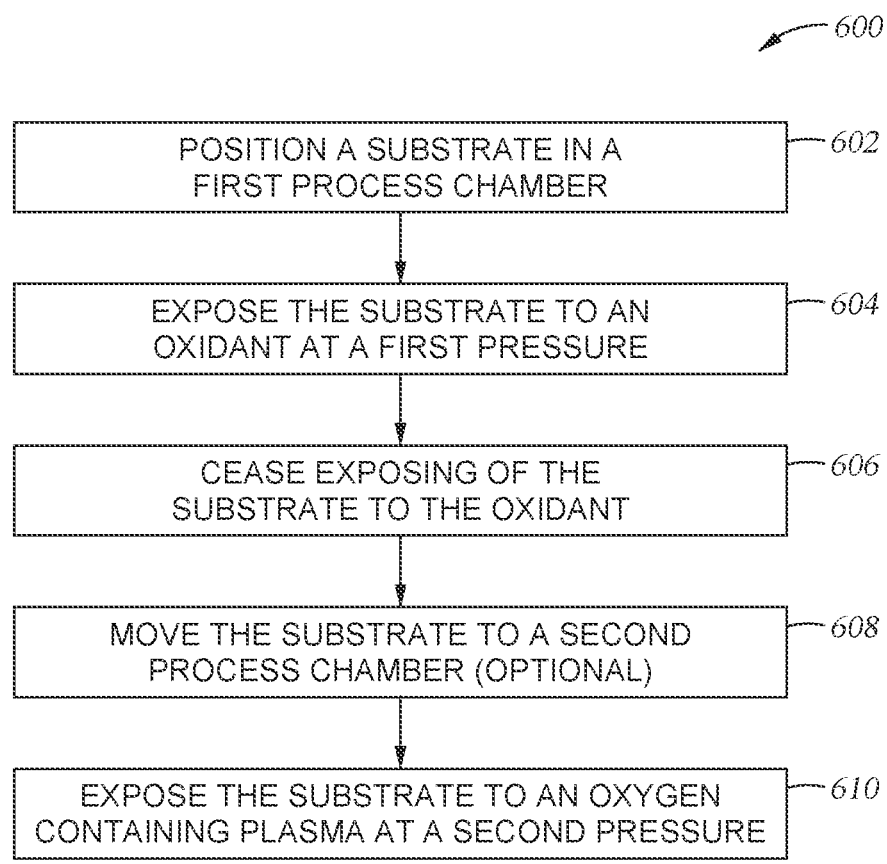
FIG. 6 is a flow diagram of the method of formation of FIG. 5A-5C, according to embodiments described herein.

A method 600 is performed on the device stack 500. The method 600 is illustrated in FIG. 6 and includes an operation 602 of positioning a substrate in a first process chamber. The substrate includes the device stack 500 and may be a substrate similar to the substrate 142 of FIGS. 1A, 1B, 2, 3, and 4. The first process chamber may be any one of the first process system 100, the second process system 100a, the fourth process system 300, or the fifth process system 400. The substrate is placed within the first process chamber on a substrate support surface.

Once the substrate is positioned in the first process chamber, the substrate is exposed to an oxidant 516 at a first pressure during another operation 604. The oxidant 516 includes oxygen and may be one or a combination of one or a mixture of hydrogen ($H_2$), oxygen ($O_2$), nitrous oxide ($N_2O$), ozone ($O_3$), water/water vapor ($H_2O$), hydrogen peroxide ($H_2O_2$), or hydroxide ($OH^-$). In one embodiment, the oxidant 516 includes water vapor ($H_2O$), ozone ($O_3$), and/or hydrogen peroxide ($H_2O_2$). In another embodiment, the oxidant 516 includes ozone ($O_3$) and hydrogen ($H_2$). The oxidant 516 may be co-flowed with a carrier gas, such that the oxidant 516 is part of an oxidant mixture containing the oxidant 516 and the carrier gas. The carrier gas may be any one or a combination of helium (He), hydrogen ($H_2$), neon (Ne), argon (Ar), krypton (Kr), xenon (Xe), or nitrogen ($N_2$). The oxidant mixture consists almost entirely of the oxidant 516 and the carrier gas, such that the oxidant mixture is entirely one or more oxidants 516 and the carrier gas. Either of water vapor, ozone, or hydrogen peroxide may be utilized individually or in combination. The oxidant 516 induces the formation of an oxide layer 522 on the silicon layer 508 as shown in FIG. 5B. When utilized by themselves, each of water vapor, ozone, and hydrogen peroxide induce a lower growth rate of the oxide layer 522 compared to when a combination of at least two of water vapor, ozone/hydrogen, and hydrogen peroxide is utilized.

The first pressure is greater than about 10 Torr, such as greater than about 15 Torr, such as greater than about 20 Torr, such as greater than about 50 Torr, such as about 50 Torr to about 760 Torr. The partial pressure of the oxidant is greater than about 10 Torr partial pressure. In some embodiments, the partial pressure of the oxidant is greater than or equal to about 50 Torr partial pressure, preferrably greater than or equal to 100 Torr partial pressure.

The temperature of the substrate and the processing region within which the substrate is disposed during the operation 604 is about 500° C. to about 1500° C., such as about 600° C. to about 1200° C., such as about 700° C. to about 1000° C., such as about 900° C.

Figure 7:
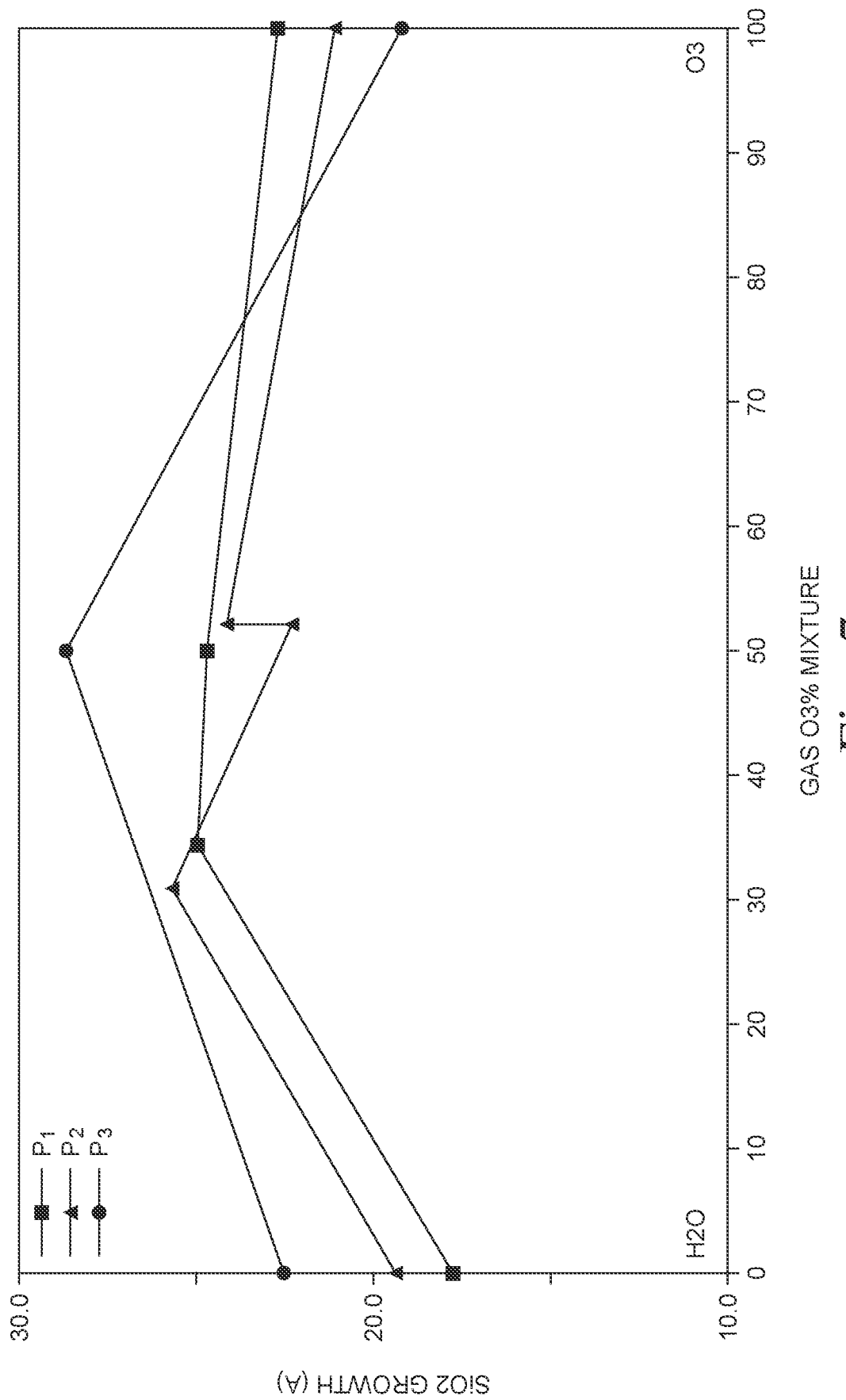
FIG. 7 is a graph illustrating an oxide growth rate on a device stack at various pressures and gas mixtures.

As shown in FIG. 7, the growth rate of silicon oxide generally increases with increased pressures and peaks when a partial pressure of ozone within the process gas mixture of $O_3$ and $H_2O$ is about 20% to about 80%, such as about 30% to about 70%. The graph includes three data sets. A first data set is the growth rate at a first pressure $P_1$. A second data set is the growth rate at a second pressure $P_2$. A third data set is the growth rate at a third pressure $P_3$. Each of the data sets includes data points where the process gas mixture contains different partial pressure percentages of ozone ($O_3$) relative to the total mixture pressure. The mixture of FIG. 7 includes ozone ($O_3$) and water vapor ($H_2O$). The first pressure $P_1$ is about 10 Torr to about 12 Torr. The second pressure $P_2$ is about 20 Torr. The third pressure $P_3$ is about 60 Torr. This data confirms the reaction of $H_2O$ and $O_3$ to form a more reactive species than predicted from a mixture of non-reacting components in the high pressure regime>10 Torr.

The transition 514 may serve as a choke point during oxide formation. The increased pressure and partial pressure during exposure of the substrate to the oxidant 516 assists in driving the oxidant 516 down into the lower portions of the features 520, such as the second portions 512 of the features 520. The increased pressure also assists in reducing the impact of the sticking coefficient on oxidation within the features 520 and compensates for the large oxidant flux rate into high aspect ratio features caused by the increase in surface area. High oxidant partial pressure has therefore been shown to improve conformality of oxide layers within high aspect ratio features.

As shown in FIG. 5B, the oxide layer 522 is grown to a desired thickness before exposure to the oxidant is ceased during another operation 606. Ceasing the exposing of the substrate to the oxidant stops the growth of the oxide layer 522 on the silicon layer 508. The desired thickness of the oxide layer 522 is a first thickness $T_1$. The first thickness $T_1$ is about 1 nm to about 3 nm. The first thickness $T_1$ is therefore about 1 nm to about 1.5 nm, about 1.5 nm to about 2 nm, or about 2 nm to about 3 nm. The first thickness $T_1$ is large enough to improve uniformity of oxide growth within the feature 520 during later process operations, but small enough to improve the manufacturing rate of the device stack 500.

It has been found the oxide layer 522 formed during the operation 604 is highly uniform throughout the feature 520. Previous attempts at oxidizing the inner surface of the features 520 are limited to features 520 with smaller depths D. The depth D of the features 520 described herein is greater than about 5 μm, such as greater than about 7 μm, such as greater than about 8 μm, such as greater than about 10 μm. The method 600 described herein enables uniform oxide layer 522 formation within features, such as the features 520, with large depths D, such as depths D greater than 5 μm.

Once exposure of the substrate to the oxidant is ceased during the operation 606, the substrate may optionally be moved to a second process chamber during another operation 608. Moving the substrate to the second process chamber is accompanied by a reduction in pressure around the substrate. The pressure is reduced from a first pressure to a second pressure. The second pressure is less than about 10 Torr, such as less than about 7 Torr, such as less than about 5 Torr, such as about 0.1 Torr to about 5 Torr. The pressure is reduced either in the first process chamber or in the second process chamber.

In some embodiments, the pressure within the processing region of the first process chamber is reduced before moving the substrate to the second process chamber, where the processing region of the second process chamber is brought to the second pressure. In other embodiments, the pressure within the processing region of the first process chamber stays the same while the substrate is moved to the second process chamber and once the substrate is within the second process chamber, the processing region within the second process chamber is depressurized to the second pressure. In yet other embodiments, the substrate remains in the first process chamber and the processing region of the first process chamber is reduced from the first pressure to the second pressure. There may be an intermediate chamber, such as a transfer chamber (not shown) coupling each of the first process chamber and the second process chamber. The substrate may therefore pass through the transfer chamber at an intermediate pressure between the first pressure and the second pressure while being transferred from the first process chamber to the second process chamber. In some embodiments, the pressure around the substrate is generally described as being reduced from the first pressure to the second pressure.

The second process chamber may be any one of the first process system 100, the third process system 100b, or the fourth process system 300. The second process chamber is equipped to plasma treat the substrate.

Once the substrate is positioned within the second process chamber, the substrate is exposed to an oxygen containing plasma at the second pressure during another operation 610. The oxygen containing plasma is configured to perform a radical oxidation of the features 520 of the substrate. The oxygen containing plasma is formed using a remote plasma source (RPS), an inductively coupled plasma (ICP) source, a capacitively coupled plasma (CCP) source, or thermal radical combustion.

The oxygen containing plasma includes radicalized oxygen atoms. As described herein, the oxygen containing plasma includes both hydrogen and oxygen molecules. The oxygen containing plasma may further contain one or more additional oxygen containing molecules, such as one or a combination of hydrogen ($H_2$), oxygen ($O_2$), nitrous oxide ($N_2O$), ozone ($O_3$), water/water vapor ($H_2O$), hydrogen peroxide ($H_2O_2$), or hydroxide ($OH^-$). In one embodiment, the oxygen containing plasma includes water vapor ($H_2O$), ozone ($O_3$), and/or hydrogen peroxide ($H_2O_2$). In another embodiment, the oxygen containing plasma includes ozone ($O_3$) and hydrogen ($H_2$). The oxygen containing plasma may be co-flowed with a carrier gas, such that the oxygen containing plasma is part of an oxygen plasma mixture containing the oxygen containing plasma and the carrier gas. The carrier gas may be any one or a combination of helium (He), hydrogen ($H_2$), neon (Ne), argon (Ar), krypton (Kr), or xenon (Xe). The oxygen plasma mixture consists almost entirely of the oxygen containing plasma and the carrier gas, such that the oxygen plasma mixture is entirely oxygen and hydrogen plasma flowed with the carrier gas.

While performing the operation 610 and exposing the substrate to the oxygen containing plasma, the processing region is kept at a second pressure of less than about 10 Torr, such as less than about 7 Torr, such as less than about 5 Torr, such as about 0.5 Torr to about 5 Torr. The pressure is reduced either in the first process chamber or in the second process chamber. The partial pressure of the oxygen containing plasma within the processing region during the operation 610 is about 0.1 Torr to about 8 Torr, such as about 0.5 Torr to about 6 Torr, such as about 0.5 Torr to about 4 Torr, such as about 1 Torr to about 3 Torr. Reducing the partial pressure of the oxygen containing plasma during the operation 610 increases the lifetime of oxygen radicals. The inventors have surprisingly discovered peak lifetime for oxygen radicals is achieved at a pressure of about 1 Torr to about 3 Torr. The oxidation rate is generally constant at the reduced partial pressure, but varies (e.g., fluctuates) or is reduced outside of the reduced partial pressures described above.

The temperature of the substrate and the processing region within which the substrate is disposed during the operation 610 is about 500° C. to about 1500° C., such as about 600° C. to about 1200° C., such as about 700° C. to about 1000° C., such as about 900° C.

During the operation 610, the oxide layer 522 is grown to a desired thickness before ceasing the exposure to the oxygen containing plasma. Ceasing the exposing of the substrate to the oxygen containing plasma halts the growth of the oxide layer 522 on the silicon layer 508. The desired thickness of the oxide layer 522 after the operation 610 is a second thickness $T_2$. The second thickness $T_2$ is about 2 nm to about 10 nm, such as about 2 nm to about 8 nm, such as about 3 nm to about 6 nm, such as about 4 nm to about 5 nm. In some embodiments, the second thickness $T_2$ is about 6 nm to about 10 nm.

The growth rate of the oxide layer 522 during the oxygen containing plasma exposure of operation 610 is greater than the growth rate of the oxide layer 522 during the high pressure oxide exposure of operation 604. The plasma exposure of operation 610 is utilized to increase the overall growth rate of the oxide layer 522. The growth rate of the oxide layer 522 during the high pressure oxide exposure of operation 604 is a first growth rate and is less than about 30 Angstroms/(square root minute), such as less than about 25 Angstroms/(square root minute), such as less than about 20 Angstroms/(square root minute). The growth rate of the oxide layer 522 during the oxygen containing plasma exposure of operation 610 is greater than about 20 Angstroms/(square root minute), such as about 30 Angstroms/(square root minute) to about 40 Angstroms/(square root minute).

As described herein, each of the high pressure oxide exposure of operation 604 and the oxygen containing plasma exposure of operation 610 may be performed in either the same or different process chambers. In one embodiments, the high pressure oxide exposure of operation 604 and the oxygen containing plasma exposure of operation 610 are both performed in the first process system 100. In another embodiment, the high pressure oxide exposure of operation 604 is performed in the second process system 100a and the high of operation 610 is performed in the third process system 100b. In yet another embodiment, the high pressure oxide exposure of operation 604 and the oxygen containing plasma exposure of operation 610 are both performed in the fourth process system 300. In yet another embodiment, the high pressure oxide exposure of operation 604 is performed in a process system similar to the fourth process system 300 while the oxygen containing plasma exposure of operation 610 is performed in a separate process system similar to the fourth process system 300. In yet another embodiment, the high pressure oxide exposure of operation 604 is performed in the fifth process system 400 and the oxygen containing plasma exposure of operation 610 is performed in one of the third process system 100b or the fourth process system 300.

In yet another embodiment, the high pressure operation is performed in a furnace, such as the fifth process system 400 and the oxygen containing plasma exposure of operation 610 is replaced by a low pressure hydrogen ($H_2$) and oxygen ($O_2$) combustion process. The high pressure operation is performed at a pressure of greater than about 50 Torr. A mixture of hydrogen ($H_2$) and oxygen ($O_2$) may then be introduced into the fifth process system 400 during a low pressure operation, such as an operation at a pressure of less than about 1 Torr. The low pressure operation is a batch low pressure operation. During the batch low pressure operation, the hydrogen and oxygen mixture combusts and forms atomic oxygen during the low pressure operation. The combustion of the hydrogen and oxygen mixture is utilized in place of the plasma exposure while in a batch system, such as the fifth process system 400.

Due to the operations described herein, the oxide layer 522 has a uniform thickness throughout the depth of the feature 520. The uniformity of the oxide layer 522 is measured by measuring the thickness of the oxide layer 522 at cross sections 530, 532 through the first portion 510 and the second portion 512 of the feature 520. A first cross-section 530 is taken about 250 nm to about 750 nm from the top surface 518 of the device stack 500, such as about 300 nm to about 700 nm, such as about 400 nm to about 600 nm, such as about 500 nm. The second cross-section 532 is taken about 250 nm to about 750 nm from the bottom surface 509 of the feature 520 of the device stack 500, such as about 300 nm to about 700 nm, such as about 400 nm to about 600 nm, such as about 500 nm. The thicknesses of the oxide layer 522 as measured at the first cross-section 530 and the second cross-section 532 has a high conformality. As described herein, conformality is measured as the thickness of the oxide layer 522 at the second cross-section 532 over the thickness of the oxide layer 522 at the first cross-section 530. The conformality when utilizing methods described herein has been found to be greater than about 95%, such as greater than about 96%, such as greater than about 97%, such as greater than about 98%.

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate, suitable for use in semiconductor manufacturing, comprising:
   a process system comprising:
      a chamber body;
      a process gas source coupled to the chamber body and configured to introduce a process gas into a processing region;
   a substrate support configured to support a substrate within the processing region; and
   a controller configured to:
      expose a substrate to an oxidant from the process gas source at a partial pressure of at least 100 Torr;
      reduce a pressure around the substrate from the first pressure to a second pressure of less than about 10 Torr; and
      expose the substrate to an oxygen containing plasma while the pressure around the substrate is at the second pressure.

2. The apparatus of claim 1, wherein the process system further comprises a plasma source coupled to the chamber body and configured to introduce a plasma into the processing region.

3. The apparatus of claim 1, wherein the process system is a first process system and the apparatus further comprises a second process system comprising a plasma source coupled to a second chamber body and configured to introduce a plasma into a second processing region.

4. The apparatus of claim 1, wherein the process system is a configured to process a plurality of substrates simultaneously.

5. The apparatus of claim 4, wherein the substrate support further comprises a plurality of substrate support shelves.

6. The apparatus of claim 1, wherein an inductive coil is disposed around the chamber body.

7. A non-transitory computer-readable medium storing instructions suitable for use in semiconductor manufacturing that, when executed by a processor, cause a computer system to perform the steps of:
   exposing a substrate to an oxidant at a partial pressure of at least 100 Torr;
   reducing a pressure around the substrate from the first pressure to a second pressure of less than about 10 Torr; and
   exposing the substrate to an oxygen containing plasma while the pressure around the substrate is at the second pressure.

8. The medium of claim 7, wherein the oxygen containing plasma is formed using a remote plasma source or an inductively coupled plasma source.

9. The medium of claim 7, wherein the oxidant includes one or a mixture of ozone, nitrous oxide, water, hydrogen, and hydrogen peroxide and the oxygen containing plasma includes radicalized oxygen atoms.

10. The medium of claim 7, wherein the first pressure is greater than about 50 Torr and the second pressure is less than about 5 Torr and the substrate is disposed on a substrate support at a temperature of about 600° C. to about 1200° C. during each of the exposing the substrate to the oxidant and the exposing the substrate to the oxygen containing plasma.

11. A method of processing a substrate suitable for use in semiconductor manufacturing, comprising:
    exposing a plurality of features having a silicon wall surface or a nitride wall surface on a substrate to an oxidant at a first pressure of greater than 100 Torr to form an oxide layer on the silicon wall surface or the nitride wall surface;
    reducing a pressure around the substrate from the first pressure to a second pressure of less than about 5 Torr; and
    exposing the substrate to an oxygen containing plasma while the pressure around the substrate is at the second pressure to increase a thickness of the oxide layer.

12. The method of claim 11, wherein the oxide layer has a first thickness of about 2 nm to about 3 nm after exposing the plurality of features to the oxidant and a second thickness of about 6 nm to about 10 nm after exposing the plurality of features to the oxygen containing plasma.

13. The method of claim 11, wherein the exposing the plurality of features to the oxidant is performed in a first chamber and the exposing the plurality of features to the oxygen containing plasma is performed in a second chamber.

14. The method of claim 11, wherein the plurality of features have the nitride wall surface and the nitride wall surface is a silicon nitride surface and the oxide layer is a silicon oxide.

15. The method of claim 11, wherein each of the plurality of features have a depth of greater than about 5 μm and an aspect ratio of greater than about 70:1.

16. The method of claim 11, wherein the substrate is disposed on a substrate support at a temperature of about 600° C. to about 1200° C. during each of the exposing the substrate to the oxidant and the exposing the substrate to the oxygen containing plasma.

17. The method of claim 11, wherein the features are formed in a layer stack comprising a plurality of silicon oxide layers and a plurality of silicon nitride layers.

18. The method of claim 11, wherein the oxidant includes one or a mixture of ozone, nitrous oxide, water, hydrogen, and hydrogen peroxide.

19. The method of claim 11, wherein the oxygen containing plasma includes radicalized oxygen atoms.

20. The method of claim 19, wherein the oxygen containing plasma further includes hydrogen and oxygen molecules.

* * * * *